United States Patent
Mori

(10) Patent No.: US 11,362,636 B2
(45) Date of Patent: Jun. 14, 2022

(54) MULTIPLEXER, FRONT END CIRCUIT, AND COMMUNICATION DEVICE

(71) Applicant: Murata Manufacturing Co., Ltd., Kyoto (JP)

(72) Inventor: Hirotsugu Mori, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/163,781

(22) Filed: Feb. 1, 2021

(65) Prior Publication Data

US 2021/0242853 A1  Aug. 5, 2021

(30) Foreign Application Priority Data

Feb. 4, 2020 (JP) .............................. JP2020-017319

(51) Int. Cl.
*H03H 7/46* (2006.01)
*H03H 7/01* (2006.01)
(Continued)

(52) U.S. Cl.
CPC ............. *H03H 7/461* (2013.01); *H03F 3/245* (2013.01); *H03H 7/0115* (2013.01); *H03H 9/54* (2013.01);
(Continued)

(58) Field of Classification Search
CPC ........ H03H 7/461; H03H 7/0115; H03H 9/54; H03F 3/245; H03F 2200/294; H03F 2200/451; H04B 1/40
See application file for complete search history.

(56) References Cited

U.S. PATENT DOCUMENTS

| 7,398,059 B2 * | 7/2008 | Uejima | ................. H04B 1/48 361/306.3 |
| 9,742,451 B2 | 8/2017 | Yatsenko et al. | |

(Continued)

FOREIGN PATENT DOCUMENTS

| JP | 2004-194240 A | 7/2004 |
| JP | 2006-128881 A | 5/2006 |
| WO | 2019/138786 A1 | 7/2019 |

OTHER PUBLICATIONS

Huawei et al., WF on UE and BS RF requirements for introduction of FDD bands with variable duplex, 3GPP TSG-RAN WG4 Meeting, Oct. 14-18, 2019, pp. 1-8, R4-1913075, Chongqing, China.

*Primary Examiner* — Nguyen T Vo
(74) *Attorney, Agent, or Firm* — Pearne & Gordon LLP

(57) ABSTRACT

A multiplexer includes a first acoustic wave filter, a second acoustic wave filter, and an inductor-capacitor (LC) filter each connected to a common terminal. A passband of the second acoustic wave filter is between a passband of the first acoustic wave filter and a passband of the LC filter, a frequency gap between the passband of the second acoustic wave filter and the passband of the LC filter is greater than a frequency gap between the passband of the first acoustic wave filter and the passband of the second acoustic wave filter, the passband of the first acoustic wave filter includes a transmission band of the first communication band, the passband of the LC filter includes a reception band of the first communication band, and the passband of the second acoustic wave filter includes a reception band of a second communication band.

14 Claims, 9 Drawing Sheets

(51) Int. Cl.
  *H03F 3/24* (2006.01)
  *H03H 9/54* (2006.01)
  *H04B 1/40* (2015.01)

(52) U.S. Cl.
  CPC ......... *H04B 1/40* (2013.01); *H03F 2200/294* (2013.01); *H03F 2200/451* (2013.01)

(56) References Cited

U.S. PATENT DOCUMENTS

| | | |
|---|---|---|
| 2004/0116098 A1 | 6/2004 | Ochii et al. |
| 2016/0127015 A1 | 5/2016 | Wloczysiak et al. |
| 2017/0093374 A1 | 3/2017 | Yatsenko et al. |
| 2018/0241418 A1* | 8/2018 | Takamine ............ H04B 1/0057 |
| 2018/0337706 A1* | 11/2018 | Yamazaki ................ H03F 3/19 |
| 2019/0356344 A1 | 11/2019 | Takada |
| 2020/0336132 A1 | 10/2020 | Matsubara |

\* cited by examiner

MULTIPLEXER, FRONT END CIRCUIT, AND COMMUNICATION DEVICE

CROSS REFERENCE TO RELATED APPLICATION

The present application is based on and claims priority of Japanese Patent Application No. 2020-017319 filed on Feb. 4, 2020. The entire disclosure of the above-identified application, including the specification, drawings and claims is incorporated herein by reference in its entirety.

TECHNICAL FIELD

The present disclosure relates to multiplexers, front end circuits, and communication devices.

BACKGROUND

In recent communication service, the width of a communication band is increased, and a plurality of communication bands are simultaneously used, in order to increase communication capacity and the speed of communication.

Japanese Unexamined Patent Application Publication No. 2006-128881 discloses a multiplexer that can demultiplex and multiplex radio frequency signals in two different communication bands. The multiplexer disclosed in Japanese Unexamined Patent Application Publication No. 2006-128881 includes an inductor-capacitor (LC) filter that includes an inductor and a capacitor. According to this, radio frequency (RF) signals in wide communication bands can be demultiplexed and multiplexed.

BRIEF SUMMARY

The Third Generation Partnership Project (3GPP) has recently defined simultaneous transfer of radio frequency signals in frequency bands of 5th Generation New Radio (5G NR) such as n77 (3300 MHz to 4200 MHz), n78 (3300 MHz to 3800 MHz), and n79 (4400 MHz to 5000 MHz). Furthermore, 3GPP has also defined new communication bands of 5G NR in which the transmission and reception bands are distant, such as n91 (the transmission band ranging from 832 MHz to 862 MHz, and the reception band ranging from 1427 MHz to 1432 MHz), n92 (the transmission band ranging from 832 MHz to 862 MHz, and the reception band ranging from 1432 MHz to 1517 MHz), n93 (the transmission band ranging from 880 MHz to 915 MHz, and the reception band ranging from 1427 MHz to 1432 MHz), and n94 (the transmission band ranging from 880 MHz to 915 MHz, and the reception band ranging from 1432 MHz to 1517 MHz). When signals in such communication bands of 5G NR and a communication band adjacent to such a communication band or between the transmission and reception bands of such a communication band are simultaneously transferred, a low-loss multiplexer is necessary which increases the isolation level while handling frequency gaps between the communication bands and the bandwidths of the communication bands.

In view of this, the present disclosure provides low-loss multiplexers, low-loss front end circuits, and low-loss communication devices that increase the isolation level by handling frequency gaps between communication bands and the bandwidths of the communication bands.

In order to provide such a multiplexer, a multiplexer according to an aspect of the present disclosure includes: a first acoustic wave filter connected to a common terminal, the first acoustic wave filter including an acoustic wave resonator; a second acoustic wave filter connected to the common terminal, the second acoustic wave filter including an acoustic wave resonator; and an inductor-capacitor (LC) filter connected to the common terminal, the LC filter including one or more inductors and one or more capacitors. A passband of the second acoustic wave filter is between a passband of the first acoustic wave filter and a passband of the LC filter, a frequency gap between the passband of the second acoustic wave filter and the passband of the LC filter is greater than a frequency gap between the passband of the first acoustic wave filter and the passband of the second acoustic wave filter, the passband of the first acoustic wave filter includes one of a transmission band or a reception band of a first communication band, the passband of the LC filter includes a remaining one of the transmission band or the reception band of the first communication band, and the passband of the second acoustic wave filter includes one of a transmission band or a reception band of a second communication band different from the first communication band.

According to the present disclosure, a low-loss multiplexer, a low-loss front end circuit, and a low-loss communication device that increases the isolation level while handling a frequency gap between communication bands and the bandwidths of the communication bands.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION OF EMBODIMENTS

Figure 1:
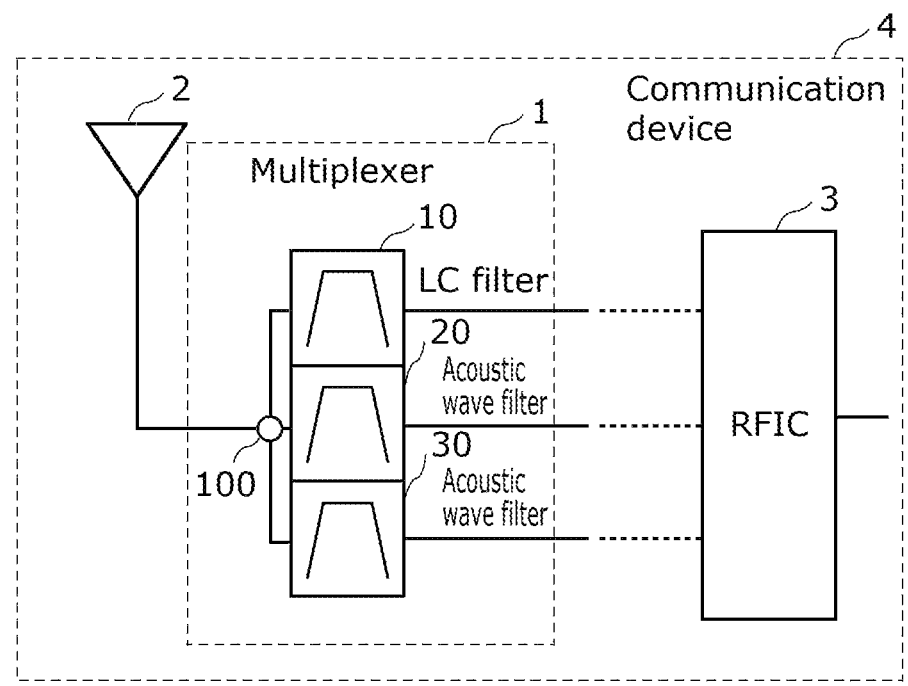
FIG. 1 is a circuit block diagram illustrating a multiplexer and a communication device according to Embodiment 1.

The following describes in detail embodiments of the present disclosure, with reference to the drawings. Note the embodiments, examples, and variations described below each show a general or specific example. The numerical values, shapes, materials, elements, and the arrangement and connection of the elements, for instance, described in the following embodiments, examples, and variations are mere examples, and thus are not intended to limit the present disclosure. Among the elements in the following embodiments, examples, and variations, elements not recited in any of the independent claims are described as arbitrary elements. In addition, the sizes of elements and the ratios of the sizes illustrated in the drawings are not necessarily accurate.

In the following, a "signal path" means a transfer route that includes a line through which a radio frequency signal propagates, an electrode directly connected to the line, and a terminal directly connected to the line or the electrode.

Embodiment 1

1.1 Configuration of Multiplexer 1 and Communication Device 4

FIG. 1 is a circuit block diagram illustrating multiplexer 1 and communication device 4 according to Embodiment 1. As illustrated in FIG. 1, communication device 4 includes multiplexer 1, antenna 2, and radio frequency (RF) signal processing circuit (RF integrated circuit (RFIC)) 3.

RFIC 3 is an example of an RF signal processing circuit that processes radio frequency signals transmitted and received by antenna 2. Specifically, RFIC 3 processes a reception signal input through multiplexer 1 by down-conversion, for instance, and outputs a reception signal generated by being processed to a baseband signal processing circuit (a BBIC, which is not illustrated). RFIC 3 outputs, toward multiplexer 1, a transmission signal processed based on a signal input from the BBIC.

Antenna 2 is connected to common terminal 100 of multiplexer 1, radiates a radio frequency signal output from multiplexer 1, and receives and outputs a radio frequency signal from the outside to multiplexer 1.

Note that an amplifier, a switch, and a filter, for instance, may be disposed on a signal path that connects multiplexer 1 and RFIC 3 as appropriate, according to the number of signals and the frequency band of a signal transferred through the signal path.

Multiplexer 1 is disposed between antenna 2 and RFIC 3, demultiplexes a reception signal input from antenna 2, and multiplexes a transmission signal input from RFIC 3.

1.2 Configuration of Multiplexer 1

Next, a detailed configuration of multiplexer 1 is to be described. Multiplexer 1 includes common terminal 100, inductor-capacitor (LC) filter 10, and acoustic wave filters 20 and 30 as illustrated in FIG. 1.

Common terminal 100 is connected to one of input/output terminals of LC filter 10, one of input/output terminals of acoustic wave filter 20, and one of input/output terminals of acoustic wave filter 30. Common terminal 100 is connected to antenna 2. Note that common terminal 100 may not be directly connected to antenna 2, and at least one of a switch, an impedance matching circuit, a circulator, or a distributor, for instance, may be disposed between antenna 2 and common terminal 100.

Acoustic wave filter 30 is an example of a first acoustic wave filter, and includes an acoustic wave resonator. Acoustic wave filter 20 is an example of a second acoustic wave filter, and includes an acoustic wave resonator. LC filter 10 includes one or more inductors and one or more capacitors. Acoustic wave filters 20 and 30 and LC filter 10 are connected to common terminal 100. Note that acoustic wave filters 20 and 30 and LC filter 10 are each directly connected to common terminal 100. However, circuit elements for adding inductance/capacitance may be disposed on signal paths that connect common terminal 100 to acoustic wave filters 20 and 30 and LC filter 10.

Note that common terminal 100 may be connected, via a switch, to the one of the input/output terminals of LC filter 10, the one of the input/output terminals of acoustic wave filter 20, and the one of the input/output terminals of acoustic wave filter 30. Specifically, the switch may include a switch common terminal and first to third selection terminals, the switch common terminal may be connected to common terminal 100, the first selection terminal may be connected to the one of the input/output terminals of LC filter 10, the second selection terminal may be connected to the one of the input/output terminals of acoustic wave filter 20, and the third selection terminal may be connected to the one of the input/output terminals of acoustic wave filter 30. In the above connecting configuration, the switch switches between connection and disconnection of the switch common terminal to/from the first selection terminal, between connection and disconnection of the switch common terminal to/from the second selection terminal, and between connection and disconnection of the switch common terminal to/from the third selection terminal.

The acoustic wave resonators included in acoustic wave filters 20 and 30 may be surface acoustic wave (SAW) resonators or bulk acoustic wave (BAW) resonators. Note that SAWs include not only surface waves but also boundary waves.

Note that an acoustic wave filter is defined as being a filter having a passband formed by an acoustic wave resonator. Accordingly, such an acoustic wave filter may also include an inductor and a capacitor for forming an attenuation pole outside the passband.

An LC filter is defined as being a filter having a passband formed by one or more inductors and one or more capacitors. Accordingly, the LC filter may also include an acoustic wave resonator for forming an attenuation pole outside the passband.

Figure 2A:
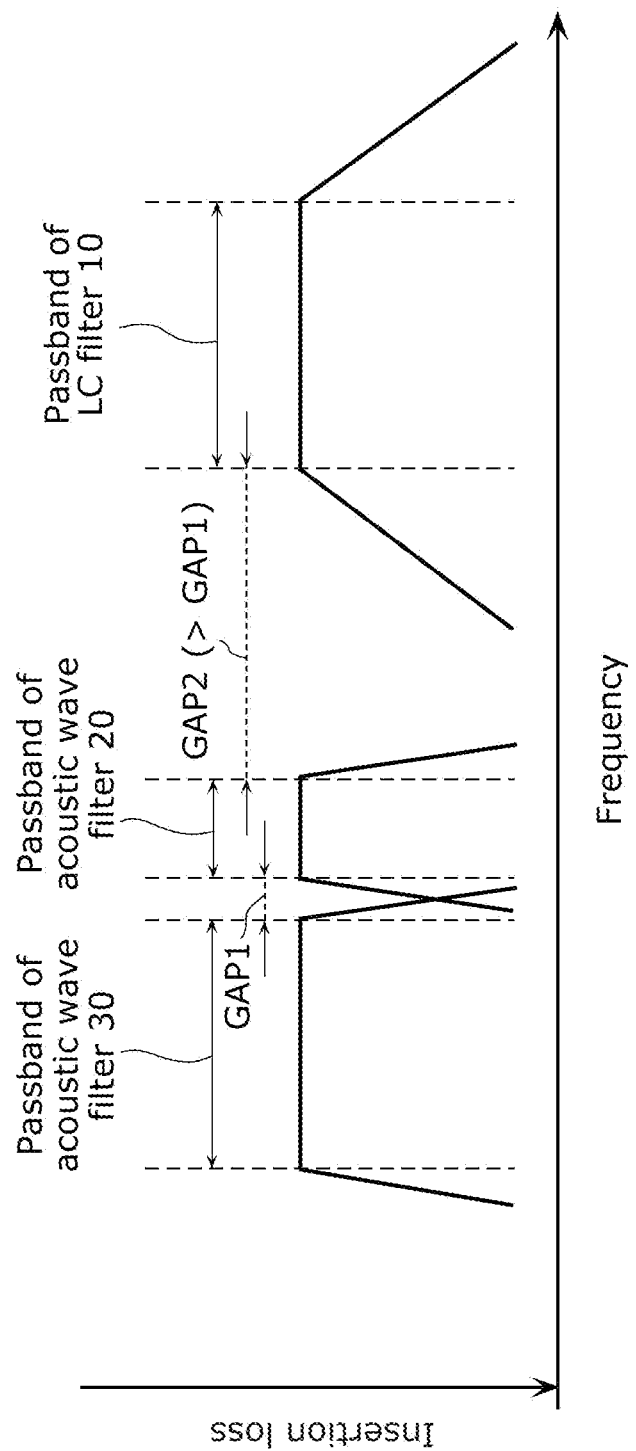
FIG. 2A illustrates a first example of a frequency relation of the passbands of filters included in the multiplexer according to Embodiment 1.

FIG. 2A illustrates a first example of a frequency relation of the passbands of filters included in multiplexer 1 according to Embodiment 1. FIG. 2A schematically shows the passbands of acoustic wave filters 20 and 30 and LC filter 10.

As illustrated in FIG. 2A, the passband of acoustic wave filter 20 is between the passband of acoustic wave filter 30 and the passband of LC filter 10. Frequency gap GAP2 between the passband of acoustic wave filter 20 and the passband of LC filter 10 is greater than the frequency gap GAP1 between the passband of acoustic wave filter 30 and the passband of acoustic wave filter 20.

Note that in this specification, a frequency gap between passband A and passband B is defined as being a difference in frequency between an edge of passband A closer to passband B out of the two edges and an edge of passband B closer to passband A out of the two edges.

Figure 3:
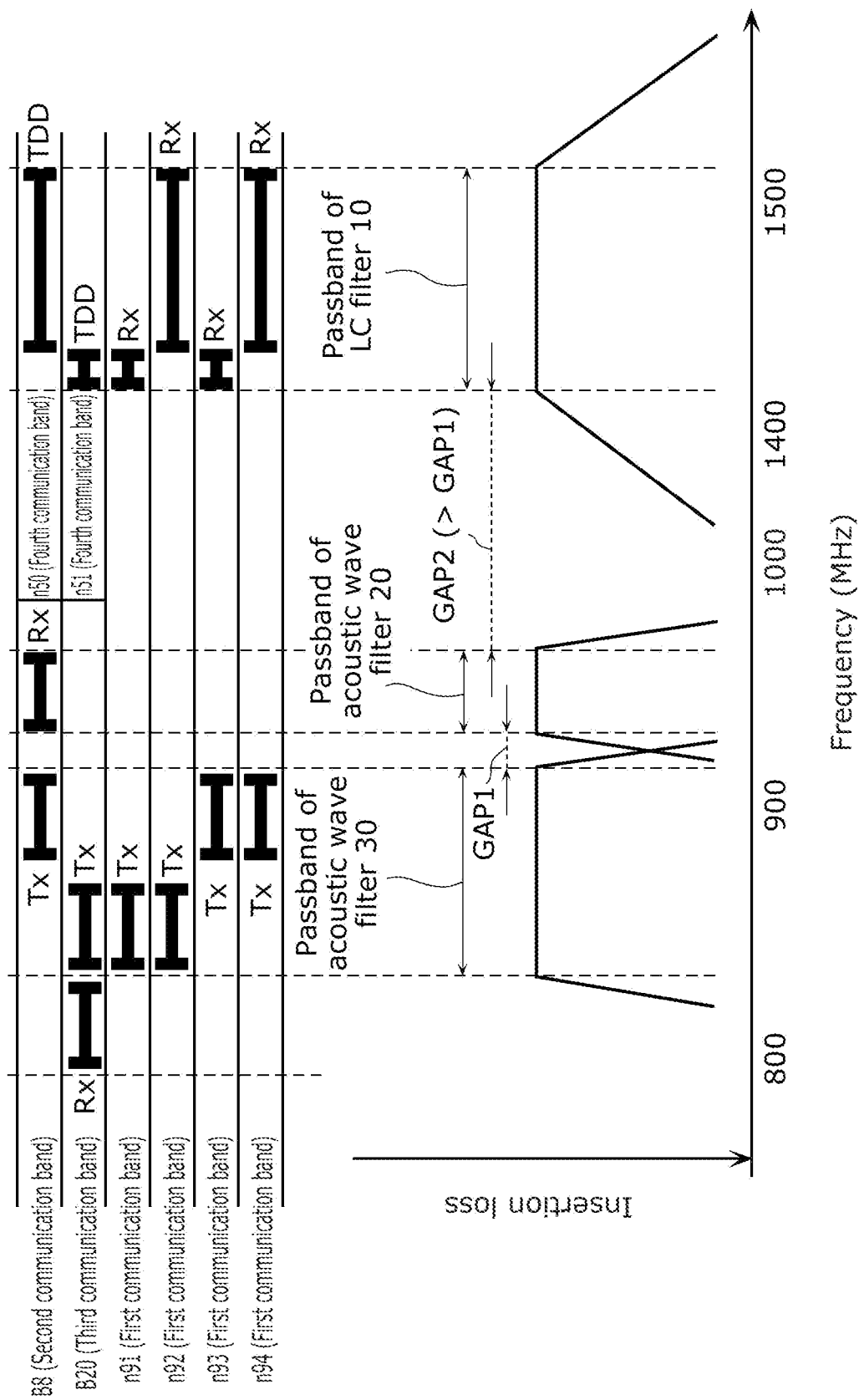
FIG. 3 illustrates communication bands used as the passbands of the filters included in the multiplexer according to Embodiment 1.

FIG. 3 illustrates communication bands used as the passbands of the filters included in multiplexer 1 according to Embodiment 1. As illustrated in FIG. 3, the passband of acoustic wave filter 30 includes the transmission bands of a first communication band (n91, n92, n93, and n94 of 5G NR), for example. The passband of acoustic wave filter 20 includes the reception band (925 MHz to 960 MHz) of a second communication band (4G LTE Band 8) different from the first communication band, for example. The passband of LC filter 10 includes the reception bands of the first communication band (n91, n92, n93, and n94 of 5G NR), for example.

Note that examples of the first communication band are not limited to n91, n92, n93, and n94 of 5G NR. The second communication band is not limited to 4G LTE Band 8. It is sufficient if the first communication band and the second communication band satisfy the relation that the passband of acoustic wave filter 30 includes one of the transmission band or the reception band of the first communication band, the passband of LC filter 10 includes the other of the transmission band and the reception band of the first communication band, and the passband of acoustic wave filter 20 includes one of the transmission band or the reception band of the second communication band.

According to the above configuration of multiplexer 1, in a frequency relation in which one of the transmission band or the reception band of the second communication band is between the transmission band and the reception band of the first communication band, acoustic wave filters 20 and 30 each having steep attenuation slopes at the two edges of the passband are used as filters having passbands that are two frequency bands adjacent to each other with the narrow frequency gap GAP1 therebetween, taking into consideration the case where the first communication band and the second communication band are simultaneously used. On the other hand, LC filter 10 having a low-loss wide passband is used as a filter having a passband that is another frequency band with the wide frequency gap GAP2. Accordingly, acoustic wave filters 20 and 30 can be given high-level isolation characteristics achieved by steep attenuation slopes, and LC filter 10 can be given a wide and low-loss passband. Thus, low-loss multiplexer 1 can be provided which increases the isolation level by handling frequency gaps between communication bands and the bandwidths of the communication bands.

3GPP has newly defined communication bands n91 to n94 used for 5G NR. The transmission bands of n91 to n94 are in a frequency range from 800 MHz to 1000 MHz, and the reception bands thereof are in a frequency range from 1400 MHz to 1600 MHz. Accordingly, the transmission bands and the reception bands of n91 to n94 are distant by at least 400 MHz. Thus, the transmission bands of n91 to n94 overlap at least partially a communication band belonging to a low band group (up to 1 GHz), and the reception bands of n91 to n94 overlap at least partially a communication band belonging to a middle high band group (1.4 GHz to 2.8 GHz). Furthermore, a communication band belonging to a low band group or a middle high band group is between the transmission and reception bands of n91 to n94. A multiband front end circuit is necessary which supports communication bands n91 to n94 having such a frequency relation.

In view of this, multiplexer 1 according to the present embodiment is applied to a frequency relation in which the reception band of 4G LTE Band 8 (the second communication band) is between the transmission and reception bands of 5G NR n91 to n94 (the first communication band), for example. Here, when 5G NR n91 to n94 and 4G LTE Band 8 are simultaneously used, acoustic wave filters 30 and 20 are used as filters having passbands that are the transmission bands of n91 to n94 and the reception band of Band 8 that are adjacent to one another with the narrow frequency gap GAP1. On the other hand, LC filter 10 is used as a filter having a passband that includes the reception bands of n91 to n94 distant from the transmission bands of n91 to n94 and the reception band of Band 8 with the wide frequency gap GAP2. Accordingly, acoustic wave filters 20 and 30 can be given high-level isolation characteristics achieved by steep attenuation slopes, and LC filter 10 can be given a wide and low-loss passband. Thus, low-loss multiplexer 1 can be provided which increases the isolation level by handling frequency gaps made with other communication bands in a frequency region between the transmission bands and the reception bands of 5G NR n91 to n94 and the bandwidths of the communication bands.

Note that the passband of LC filter 10 may be wider than the passband of acoustic wave filter 30, and may be wider than the passband of acoustic wave filter 20.

Accordingly, a wide band with relatively the wide frequency gap GAP2 that is one of the transmission band and the reception band of the first communication band can be used as the passband of LC filter 10, and a narrow band with the relatively narrow frequency gap GAP1 that is the other of the transmission band and the reception band of the first communication band can be used as the passband of acoustic wave filter 30. Thus, a signal in the first communication band can be transferred while loss is kept low and the isolation level is kept high.

The passband of LC filter 10 may be higher than a frequency at which a higher-order mode spurious emission is caused by acoustic wave filter 30. When acoustic wave filter 30 has a configuration in which leaky waves that propagate along the surface of a piezoelectric substrate made of $LiTaO_3$ are used or a configuration in which Rayleigh waves that propagate along the surface of a piezoelectric substrate made of $LiNbO_3$ are used, so-called higher-order mode spurious emissions are generated in a frequency domain defined by 1.2 to 1.4 times the fundamental wave frequency.

In contrast, the passband of LC filter 10 is higher than a frequency at which a higher-order mode spurious emission is caused by acoustic wave filter 30, and thus the deterioration of characteristics of LC filter 10 due to the spurious emission can be lowered.

Note that the first communication band may be a communication band used in 5G NR. In particular, the first communication band may be at least one of n91, n92, n93, and n94 of 5G NR, as illustrated in FIG. 3.

The second communication band may be 4G LTE Band 8 (the transmission band: 880 MHz to 915 MHz, the reception band: 925 MHz to 960 MHz) as illustrated in FIG. 3, and the passband of acoustic wave filter 30 may also include the transmission band of Band 8.

The passband of acoustic wave filter 30 may also include one of the transmission band and the reception band of a third communication band different from the first communication band and the second communication band. The third communication band is 4G LTE Band 20 (the transmission band: 832 MHz to 862 MHz, the reception band: 791 MHz to 821 MHz), as illustrated in FIG. 3. The third communication band may be, for example, 5G NR n81 (a transmission dedicated band: 880 MHz to 915 MHz) or 5G NR n82 (a transmission dedicated band: 832 MHz to 862 MHz).

The passband of LC filter 10 may also include a fourth communication band different from the first communication band and the second communication band. The fourth communication band is at least one of 5G NR n50 (1432 MHz to 1517 MHz) or 5G NR n51 (1427 MHz to 1432 MHz), as illustrated in FIG. 3. The fourth communication band may be, for example, 5G NR n75 (a reception dedicated band: 1432 MHz to 1517 MHz) or 5G NR n76 (a reception dedicated band: 1427 MHz to 1432 MHz).

Note that in multiplexer 1 according to the present embodiment, the passband of acoustic wave filter 30 is lower than the passband of acoustic wave filter 20, and the passband of acoustic wave filter 20 is lower than the passband of LC filter 10, as illustrated in FIGS. 2A and 3. Accordingly, the passband of LC filter 10 is higher than the passband of acoustic wave filter 30. However, multiplexer 1 according to the present embodiment is not limited to this frequency relation.

Figure 2B:
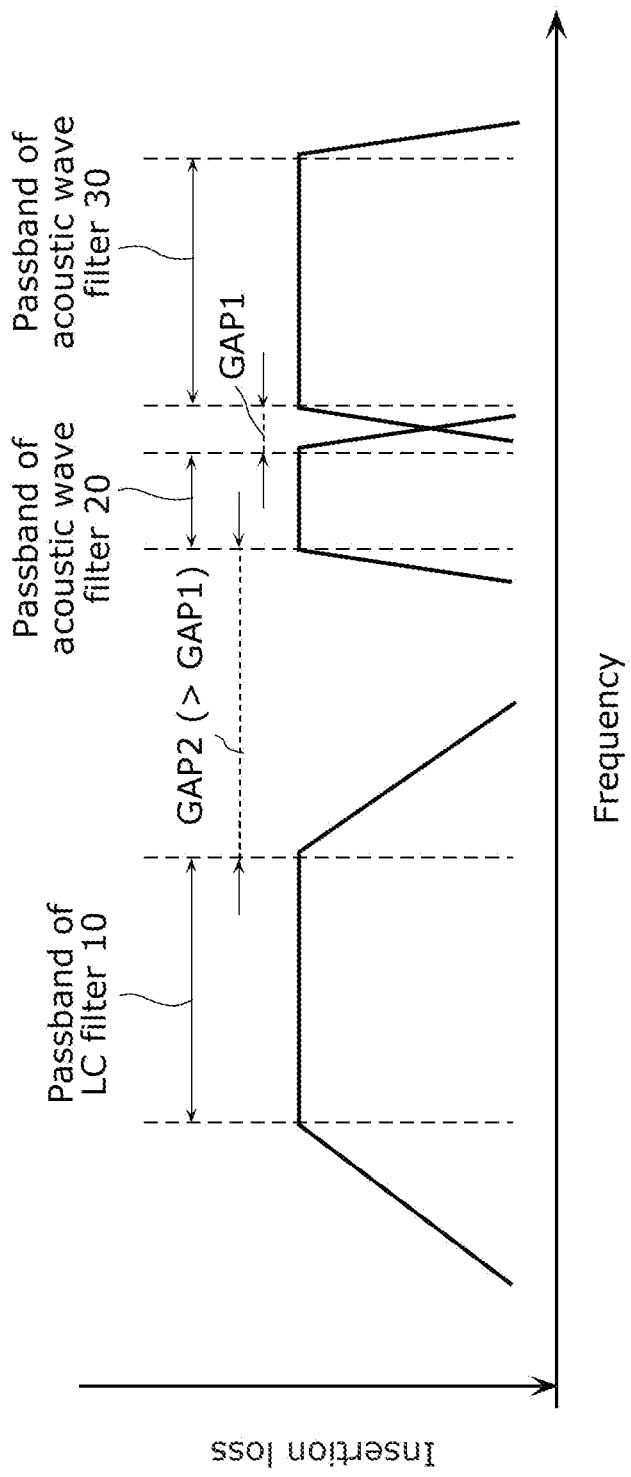
FIG. 2B illustrates a second example of a frequency relation of the passbands of the filters included in the multiplexer according to Embodiment 1.

FIG. 2B illustrates a second example of a frequency relation of the passbands of the filters included in multiplexer 1 according to Embodiment 1. As illustrated in FIG. 2B, in multiplexer 1, the passband of acoustic wave filter 30 may be higher than the passband of acoustic wave filter 20, and the passband of acoustic wave filter 20 may be higher than the passband of LC filter 10. Accordingly, the passband of LC filter 10 may be lower than the passband of acoustic wave filter 30. Note that even in this case, multiplexer 1 may satisfy the following conditions: (1) the passband of acoustic wave filter 20 is between the passband of acoustic wave filter 30 and the passband of LC filter 10, (2) the frequency gap GAP2 between the passband of acoustic wave filter 20 and the passband of LC filter 10 is wider than frequency gap GAP1 between the passband of acoustic wave filter 30 and the passband of acoustic wave filter 20, (3) the passband of acoustic wave filter 30 includes one of the transmission band and the reception band of the first communication band, (4) the passband of LC filter 10 includes the other of the transmission band and the reception band of the first communication band, and (5) the passband of acoustic wave filter 20 includes one of the transmission band and the reception band of the second communication band.

Note that as the multiplexer according to a variation of Embodiment 1, the passband of acoustic wave filter 30 may include one of the transmission band and the reception band of the first communication band, the passband of acoustic wave filter 20 includes one of the transmission band and the reception band of the second communication band different from the first communication band, and the passband of LC filter 10 may also include the transmission band of an unlicensed band for assisting transfer of a signal in the first communication band when the passband of acoustic wave filter 20 includes the reception band of the second communication band, and may include the reception band of the unlicensed band when the passband of acoustic wave filter includes the transmission band of the second communication band.

When signals in fixed frequency bands (for example, Band 7 and n78) are simultaneously transferred by dual connectivity (DC), a signal may be received also using an unlicensed band (Band 46). The first communication band is 4G LTE Band 7 (the transmission band: 2500 MHz to 2570 MHz, the reception band: 2620 MHz to 2690 MHz), for example, the second communication band is 5G NR n78 (3300 MHz to 3800 MHz), for example, and the unlicensed band for assisting transfer of a signal in the first communication band is 4G LTE Band 46 (5150 MHz to 5925 MHz), for example. In this case, at the time of transmission, signals in Band 7 and n78 are simultaneously transferred (by DC), and at the time of reception, signals in Band 7, Band 46, and n78 are simultaneously transferred (by DC). Accordingly, an LTE signal is received by assisting reception of a signal in the first communication band using the unlicensed band.

Note that the unlicensed band for assisting transfer of a signal in the first communication band may be 5G NR n46 (5150 MHz to 5925 MHz) or may be 5G NR n96 (5925 MHz to 7125 MHz).

According to the multiplexer according to this variation, in a frequency relation in which the second communication band is between the first communication band and the unlicensed band for assisting transfer of a signal in the first communication band, acoustic wave filters 20 and 30 each having steep attenuation slopes at the two edges of the passband are used as filters having passbands that are two frequency bands adjacent to each other with narrow frequency gap GAP1 therebetween, taking into consideration the simultaneous use of the first communication band and the second communication band. On the other hand, LC filter 10 having a low-loss wide passband is used as a filter having a passband that is another frequency band with the wide frequency gap GAP2. Accordingly, acoustic wave filters 20 and 30 can be given high-level isolation characteristics achieved by steep attenuation slopes, and LC filter 10 can be given a wide and low-loss passband. Thus, low-loss multiplexer 1 can be provided which increases the isolation level by handling frequency gaps between communication bands and the bandwidths of the communication bands.

1.3 Specific Configuration of Multiplexer

Figure 4:
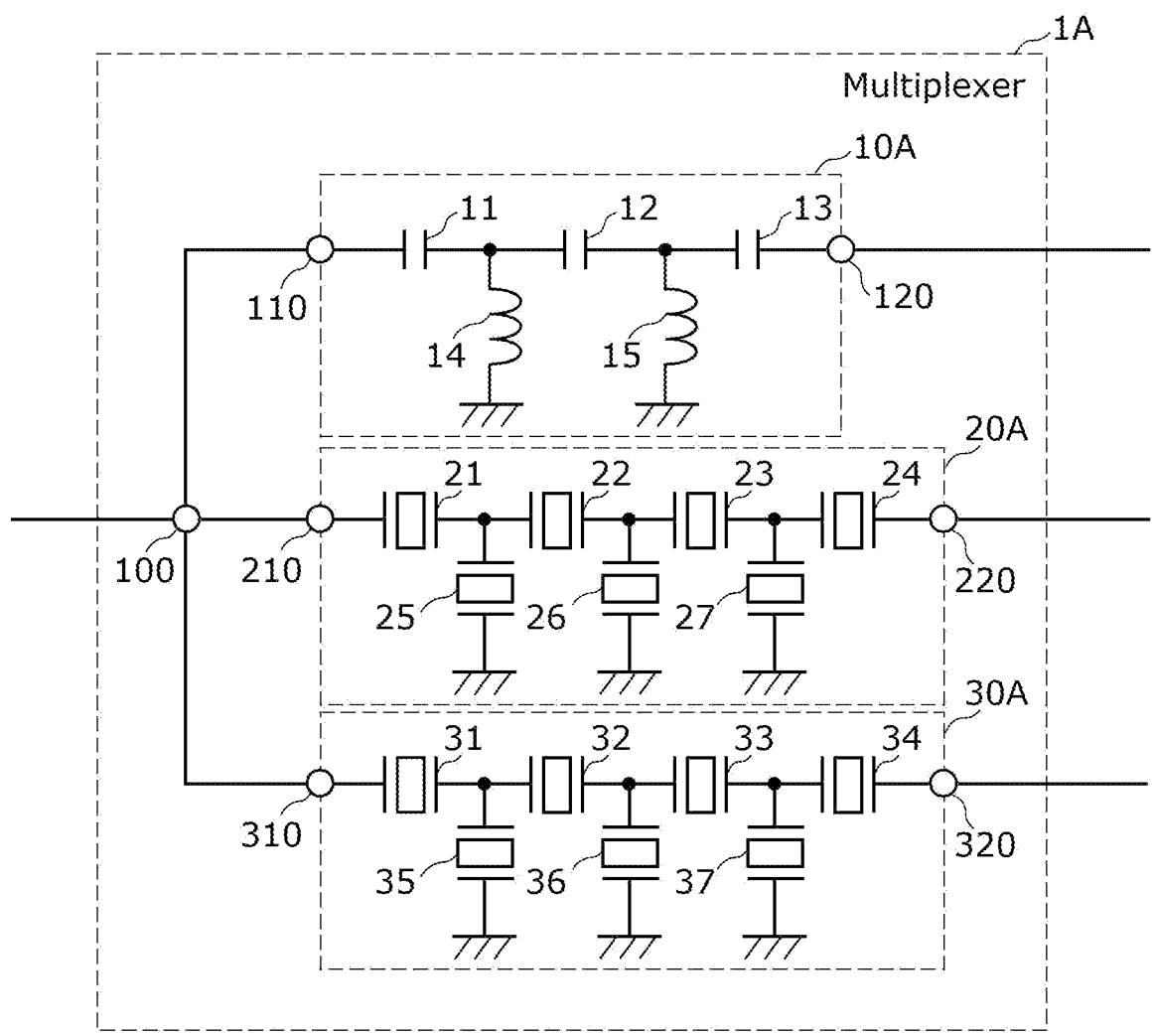
FIG. 4 illustrates a circuit configuration of a multiplexer according to an example.

FIG. 4 illustrates a circuit configuration of multiplexer 1A according to an example. Multiplexer 1A illustrated in FIG. 4 shows a specific example of a circuit configuration of the filters included in multiplexer 1 according to the embodiment.

LC filter 10A includes input/output terminals 110 and 120 (first input/output terminals), capacitors 11, 12, and 13, and inductors 14 and 15. Capacitors 11 to 13 are disposed in series on a signal path that connects input/output terminals 110 and 120. Inductor 14 is disposed between the ground and a signal path that connects capacitors 11 and 12. Inductor 15 is disposed between the ground and a signal path that connects capacitors 12 and 13. Capacitors 11 to 13 are series-arm circuits disposed on a signal path that connects common terminal 100 and input/output terminal 120, and inductors 14 and 15 are parallel-arm circuits disposed between the signal path and the ground. Note that three series-arm circuits may not be included, and it is sufficient if one or more series-arm circuits are included. Further, two parallel-arm circuits may not be included, and it is sufficient if one or more parallel-arm circuits are included.

Here, it is favorable that in LC filter 10A, out of the one or more series-arm circuits, a first series-arm circuit disposed closest to common terminal 100 is a capacitor (capacitor 11 in FIG. 4), and out of the one or more parallel-arm circuits, a first parallel-arm circuit disposed closest to common terminal 100 is an inductor (inductor 14 in FIG. 4).

Note that in LC filter 10A, out of the one or more series-arm circuits, the first series-arm circuit disposed closest to common terminal 100 may be an inductor, and out of the one or more parallel-arm circuits, the first parallel-arm circuit disposed closest to common terminal 100 may be a capacitor.

Note that one or more series-arm circuits other than the first series-arm circuit may not be capacitors, and may rather be other circuit elements. Further, one or more parallel-arm circuits other than the first parallel-arm circuit may not be inductors, and may rather be other circuit elements.

Acoustic wave filter 20A includes input/output terminals 210 and 220, series arm resonators 21, 22, 23, and 24, and parallel arm resonators 25, 26, and 27. Series arm resonators 21 to 24 are disposed in series on a signal path that connects input/output terminals 210 and 220. Parallel arm resonator 25 is disposed between the ground and a signal path that connects series arm resonators 21 and 22. Parallel arm resonator 26 is disposed between the ground and a signal path that connects series arm resonators 22 and 23. Parallel arm resonator 27 is disposed between the ground and a signal path that connects series arm resonators 23 and 24. Series arm resonators 21 to 24 and parallel arm resonators 25 to 27 are acoustic wave resonators. The above configuration makes acoustic wave filter 20A a ladder acoustic wave filter. Note that the number of the series arm resonators may not be four, and it is sufficient if one or more series arm resonators are included. Further, the number of the parallel arm resonators may not be three, and it is sufficient if one or more parallel arm resonators are included. Acoustic wave filter 20A may not be a ladder acoustic wave filter, and may be, for example, a longitudinally coupled acoustic wave filter, and the filter structure is optionally determined.

Acoustic wave filter 30A includes input/output terminals 310 and 320, series arm resonators 31, 32, 33, and 34, and parallel arm resonators 35, 36, and 37. Series arm resonators 31 to 34 are disposed in series on a signal path that connects input/output terminals 310 and 320. Parallel arm resonator 35 is disposed between the ground and a signal path that connects series arm resonators 31 and 32. Parallel arm resonator 36 is disposed between the ground and a signal path that connects series arm resonators 32 and 33. Parallel arm resonator 37 is disposed between the ground and a signal path that connects series arm resonators 33 and 34. Series arm resonators 31 to 34 and parallel arm resonators 35 to 37 are acoustic wave resonators. The above configuration makes acoustic wave filter 30A a ladder acoustic wave filter. Note that the number of the series arm resonators may not be four, and it is sufficient if one or more series arm resonators are included. Further, the number of the parallel arm resonators may not be three, and it is sufficient if one or more parallel arm resonators may be included. Acoustic wave filter 30A may not be a ladder acoustic wave filter, and may be, for example, a longitudinally coupled acoustic wave filter, and the filter structure is optionally determined.

Input/output terminals 110, 210, and 310 are connected to common terminal 100.

Figure 5A:
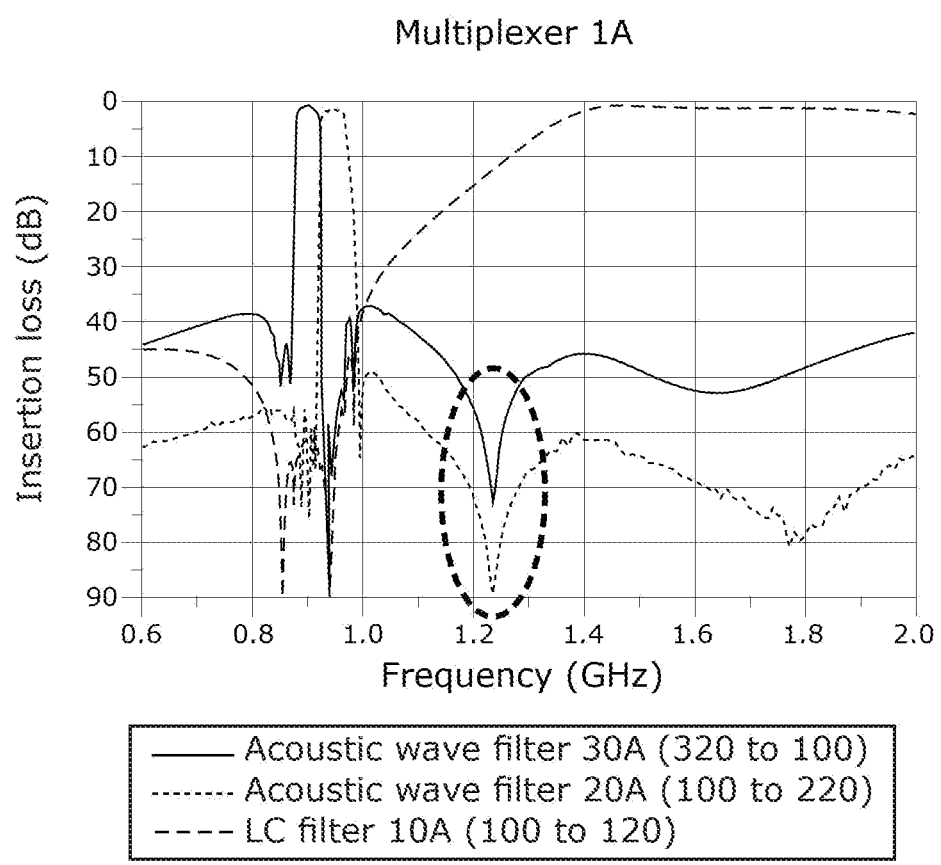
FIG. 5A is a graph illustrating passing characteristics of the multiplexer according to this example.
Figure 5B:
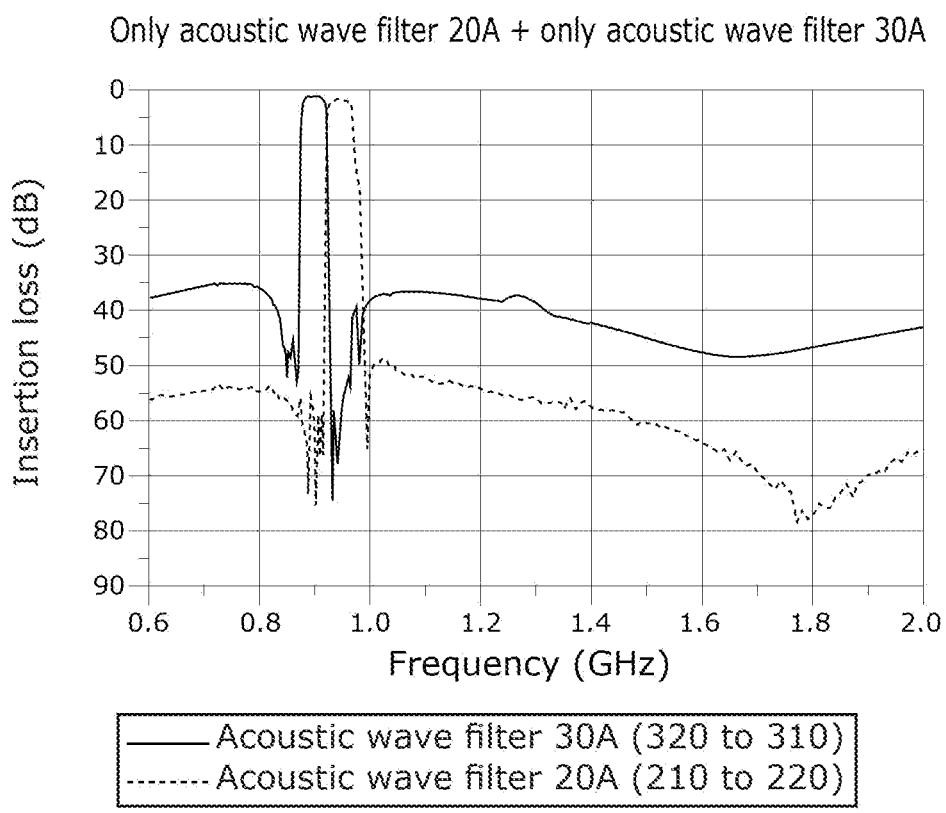
FIG. 5B is a graph illustrating passing characteristics of only each of acoustic wave filters included in the multiplexer according to this example.

FIG. 5A is a graph illustrating passing characteristics of multiplexer 1A according to this example. FIG. 5B is a graph illustrating passing characteristics of only acoustic wave filter 20A and passing characteristics of only acoustic wave filter 30A, which are included in multiplexer 1A according to this example.

In the passing characteristics of acoustic wave filters 20A and 30A of multiplexer 1A illustrated in FIG. 5A, an attenuation pole is formed in each of an attenuation band (1.2 GHz to 1.3 GHz) higher than the passband of acoustic wave filter 20A and an attenuation band (1.2 GHz to 1.3 GHz) higher than the passband of acoustic wave filter 30A. In contrast, in passing characteristics of only acoustic wave filter 20A and passing characteristics of only acoustic wave filter 30A illustrated in FIG. 5B, an attenuation pole is not formed in each of an attenuation band (1.2 GHz to 1.3 GHz) higher than the passband of acoustic wave filter 20A and an attenuation band (1.2 GHz to 1.3 GHz) higher than the passband of acoustic wave filter 30A.

In the passing characteristics of multiplexer 1A illustrated in FIG. 5A, the attenuation poles that appear at a frequency higher than the passbands are formed by an LC resonance circuit constituted by capacitor 11 and inductor 14 of LC filter 10A. In particular, out of the circuit elements included in LC filter 10A, a circuit element connected closest to common terminal 100 influences the passing characteristics of acoustic wave filters 20A and 30A.

Accordingly, capacitor 11 and inductor 14 disposed closest to common terminal 100 out of the circuit elements included in LC filter 10A can form the attenuation poles of the LC resonance circuit constituted by capacitor 11 and inductor 14 in the passing characteristics of acoustic wave filters 20A and 30A. Accordingly, the attenuation characteristics of acoustic wave filters 20A and 30A can be improved.

Since the circuit elements of LC filter 10A are used to form the attenuation poles, the number of circuit elements included in acoustic wave filters 20A and 30A can be reduced, so that multiplexer 1A can be miniaturized.

Note that when LC filter 10A is a transmission filter for a transmission signal in the first communication band, and acoustic wave filter 30A is a reception filter for a reception signal in the first communication band, an element of the transmission filter disposed closest to common terminal 100 is a capacitor or an inductor, and thus the distortion caused at the time of transmission can be reduced. Further, attenuation characteristics near the passband of the reception filter can be improved, and thus a reception sensitivity can be improved.

On the other hand, when LC filter 10A is a reception filter for a reception signal in the first communication band and acoustic wave filter 30A is a transmission filter for a transmission signal in the first communication band, attenuation characteristics near the passband of the transmission filter can be improved, and thus the isolation from an adjacent communication band can be improved. A band lower or higher than the passband of the reception filter can be attenuated, forming a wide attenuation band. Thus, the reception sensitivity can be improved by removing spurious components.

Embodiment 2

The present embodiment describes a front end circuit that includes multiplexer 1 according to Embodiment 1 (and multiplexer 1B according to a variation), and a communication device that includes the front end circuit.

2.1 Circuit Configuration of Front End Circuit 6 and Communication Device 7

Figure 6:
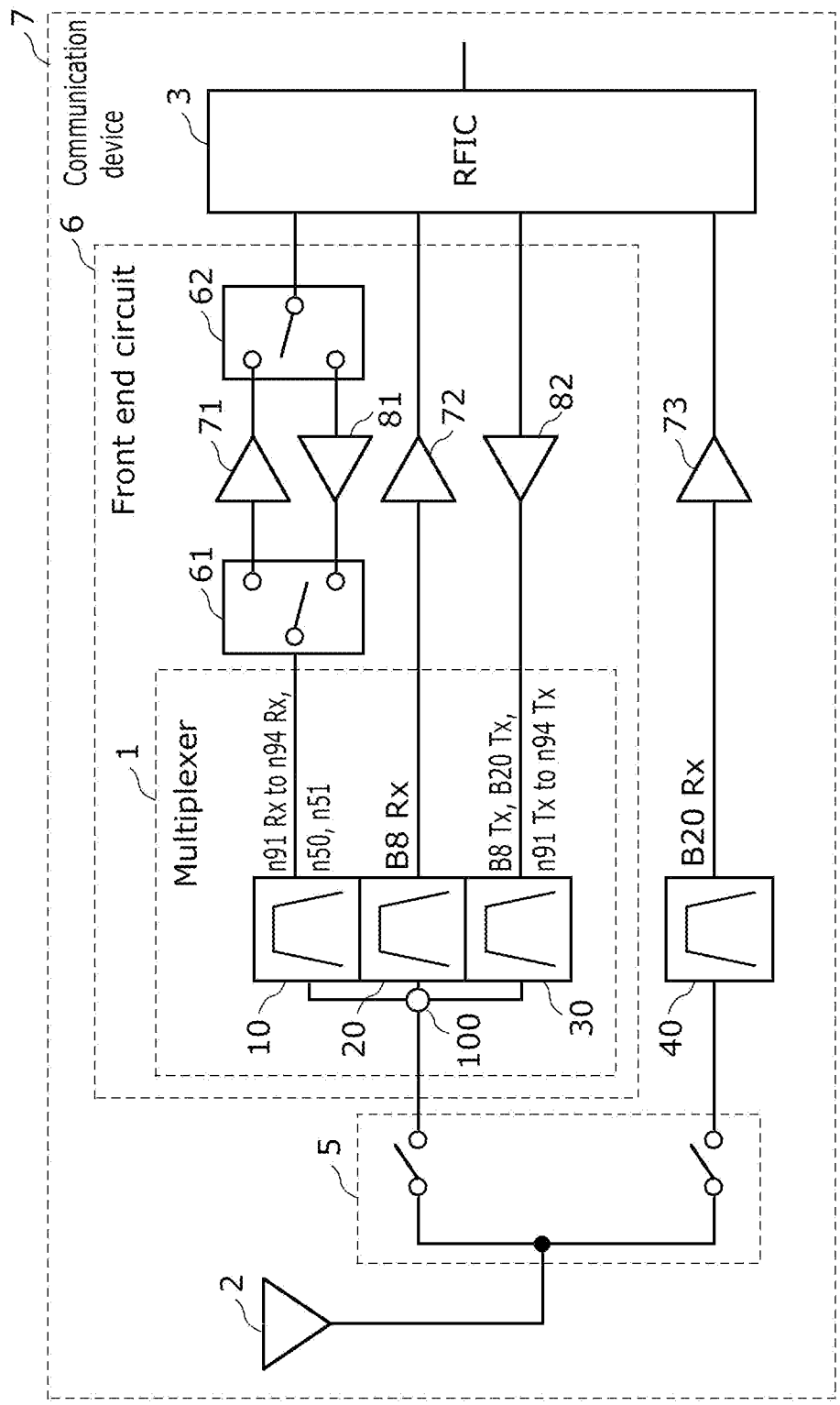
FIG. 6 is a circuit block diagram of a multiplexer, a front end circuit, and a communication device according to Embodiment 2.

FIG. 6 is a circuit block diagram of multiplexer 1, front end circuit 6, and communication device 7 according to Embodiment 2. As illustrated in FIG. 6, communication device 7 includes front end circuit 6, antenna 2, RFIC 3, switch 5, filter 40, and low noise amplifier 73. Communication device 7 according to the present embodiment differs from communication device 4 according to Embodiment 1 in that front end circuit 6 that includes multiplexer 1, switches 5, filter 40, and low noise amplifier 73 are added. The following describes communication device 7 according to the present embodiment, focusing on the differences from radio communication device 4 according to Embodiment 1 while the descriptions of the same points are omitted.

Switches 5 are disposed between (i) antenna 2 and (ii) front end circuit 6 and filter 40, and switch between connection and disconnection of antenna 2 to/from front end circuit 6, and between connection and disconnection of antenna 2 to/from filter 40.

Filter 40 is a reception filter disposed between switches 5 and low noise amplifier 73, and having a passband that is the reception band of 4G LTE Band 20, for example. Low noise amplifier 73 is a reception amplifier that is disposed between filter 40 and RFIC 3, amplifies a reception signal that has passed through filter 40, and outputs the amplified reception signal to RFIC 3.

Note that switches 5, filter 40, and low noise amplifier 73 may not be necessarily included in communication device 7 according to the present embodiment.

Front end circuit 6 includes multiplexer 1, switches 61 and 62, low noise amplifiers 71 and 72, and power amplifiers 81 and 82.

Multiplexer 1 is multiplexer 1 according to Embodiment 1, and includes common terminal 100, LC filter 10, and acoustic wave filters 20 and 30.

The passband of acoustic wave filter 30 includes the transmission bands of the first communication band (n91, n92, n93, n94 of 5G NR), for example, and further includes the transmission band of the second communication band (4G LTE Band 8) and the transmission band of the third communication band (4G LTE Band 20).

The passband of acoustic wave filter 20 includes the reception band of the second communication band (4G LTE Band 8), for example.

The passband of LC filter 10 includes the reception bands of the first communication band (n91, n92, n93, and n94 of 5G NR), and further includes the fourth communication band (n50 and n51 of 5G NR), for example.

Switch 61 is an example of a first switch, and includes a first common terminal, a first selection terminal, and a second selection terminal. Switch 61 selectively switches connection of the first common terminal between the first selection terminal and the second selection terminal. The first common terminal is connected to LC filter 10, the first selection terminal is connected to the input terminal of low noise amplifier 71, and the second selection terminal is connected to the output terminal of power amplifier 81.

Switch 62 includes a second common terminal, a third selection terminal, and a fourth selection terminal, and selectively switches connection of the second common terminal between the third selection terminal and the fourth selection terminal. The second common terminal is connected to RFIC 3, the third selection terminal is connected to the output terminal of low noise amplifier 71, and the fourth selection terminal is connected to the input terminal of power amplifier 81.

Low noise amplifier 71 is a reception amplifier that amplifies reception signals in n50 and n51 of 5G NR (the fourth communication band), and reception signals in n91, n92, and n93 and n94 of 5G NR (the first communication band).

Power amplifier 81 is a transmission amplifier that amplifies transmission signals in n50 and n51 of 5G NR (the fourth communication band).

Low noise amplifier 72 is a reception amplifier that amplifies a reception signal in 4G LTE Band 8 (the second communication band).

Power amplifier 82 is a transmission amplifier that amplifies transmission signals in n91, n92, n93, and n94 of 5G NR (the first communication band), a transmission signal in 4G LTE Band 8 (the second communication band), and a transmission signal in 4G LTE Band 20 (the third communication band).

According to the above configuration of front end circuit 6, multiplexer 1 can transfer transmission signals and reception signals in n91, n92, n93, and n94 of 5G NR by frequency division duplex (FDD), and can transfer transmission signals and reception signals in n50 and n51 of 5G NR by time division duplex (TDD). Furthermore, multiplexer 1 can transfer transmission signals and reception signals in Band 8 and Band 20 of 4G LTE by FDD.

In front end circuit 6 according to the present embodiment, an LC filter and acoustic wave filters are disposed as appropriate according to frequency gaps between the first communication band and the second communication band, and thus when transferring signals in first to fourth communication bands for which a FDD system and a TDD system are both used, it is unnecessary to further dispose any filters on signal paths that connect multiplexer 1 and low noise amplifiers 71 and 72 and signal paths that connect multiplexer 1 and power amplifiers 81 and 82. Accordingly, the number of circuit elements can be reduced while reducing the loss of front end circuit 6 and increasing the isolation level of front end circuit 6, and thus front end circuit 6 and communication device 7 can be miniaturized.

Note that in front end circuit 6 according to the present embodiment, circuit elements such as filters may be disposed on signal paths that connect multiplexer 1 and low noise amplifiers 71 and 72 and on signal paths that connect multiplexer 1 and power amplifiers 81 and 82, according to a requirement specification regarding transmission characteristics and reception characteristics that communication device 7 needs to satisfy.

Figure 7:
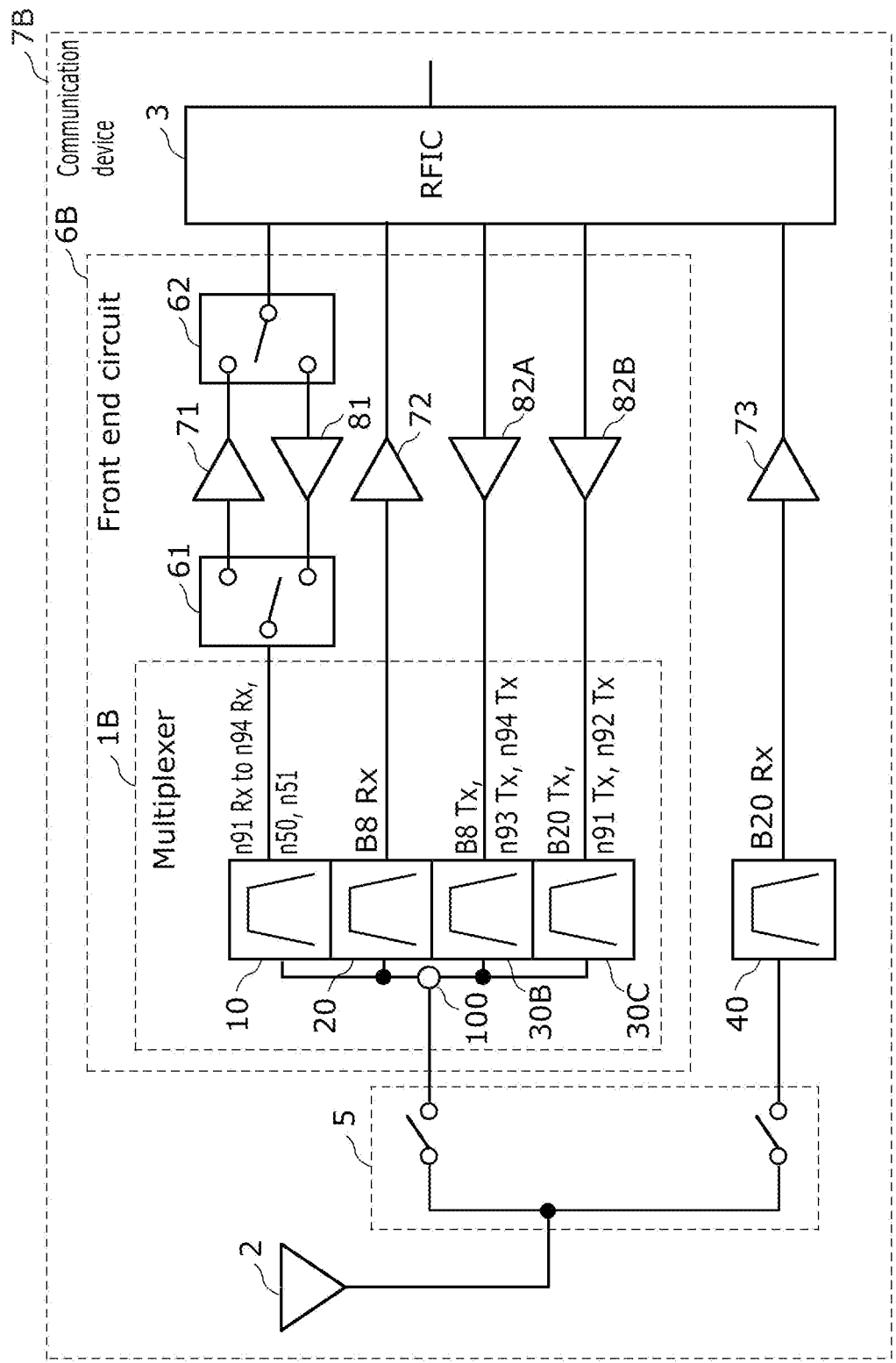
FIG. 7 is a circuit block diagram of a multiplexer, a front end circuit, and a communication device according to Embodiment 2.

2.2 Circuit Configuration of Front End Circuit 6B and Communication Device 7B According to Variation FIG. 7 is a circuit block diagram of multiplexer 1B, front end circuit 6B, and communication device 7B according to Embodiment 2. As illustrated in FIG. 7, communication device 7B includes front end circuit 6B, antenna 2, RFIC 3, switches 5, filter 40, and low noise amplifier 73. Communication device 7B according to this variation differs from communication device 7 according to Embodiment 2 in the configuration of front end circuit 6B that includes multiplexer 1B. The following describes communication device 7B according to this variation, focusing on differences from communication device 7 according to Embodiment 2 while the descriptions of the same points are omitted.

Front end circuit 6B includes multiplexer 1B, switches and 62, low noise amplifiers 71 and 72, and power amplifiers 81, 82A, and 82B.

Multiplexer 1B includes common terminal 100, LC filter 10, and acoustic wave filters 20, 30B, and 30C.

The passband of acoustic wave filter 30B includes the transmission bands of the first communication band (n93 and n94 of 5G NR), and further includes the transmission band of the second communication band (4G LTE Band 8), for example.

The passband of acoustic wave filter 30C includes the transmission bands of the first communication band (n91 and n92 of 5G NR), and further includes the transmission band of the third communication band (4G LTE Band20), for example.

Low noise amplifier 71 is a reception amplifier that amplifies reception signals in n50 and n51 of 5G NR (the fourth communication band), and reception signals in n91, n92, n93, and n94 of 5G NR (the first communication band).

Power amplifier 81 is a transmission amplifier that amplifies transmission signals in n50 and n51 of 5G NR (the fourth communication band).

Low noise amplifier 72 is a reception amplifier that amplifies a reception signal in 4G LTE Band 8 (the second communication band).

Power amplifier 82A is a transmission amplifier that amplifies transmission signals in n93 and n94 of 5G NR (the first communication band), and the transmission signal in 4G LTE Band 8 (the second communication band).

Power amplifier 82B is a transmission amplifier that amplifies transmission signals in n91 and n92 of 5G NR (the first communication band), and a transmission signal in 4G LTE Band 20 (the third communication band).

According to the above configuration of front end circuit 6B, multiplexer 1B includes four filters, whereas multiplexer 1 according to Embodiment 1 includes three filters. This is due to the fact that a frequency gap is present between (i) the transmission bands of n91 and n92 of 5G NR and (ii) the transmission bands of n93 and n94 of 5G NR. Accordingly, acoustic wave filter 30B having a passband that is the transmission bands of n91 and n92, and acoustic wave filter 30C having a passband that is the transmission bands of n93 and n94 are disposed separately.

In front end circuit 6B according to this variation, an LC filter and acoustic wave filters are disposed as appropriate according to a frequency gap between the first communication band and the second communication band, and a frequency gap between the first communication band, and thus when transferring signals in the first to fourth communication bands for which FDD and TDD are both used, it is unnecessary to further dispose any filters on signal paths that connect multiplexer 1B and low noise amplifiers 71 and 72 and signal paths that connect multiplexer 1B and power amplifiers 81, 82A, and 82B. Accordingly, the number of circuit elements can be reduced while reducing the loss of front end circuit 6B and increasing the isolation level of front end circuit 6B, and thus front end circuit 6B and communication device 7B can be miniaturized.

Note that in front end circuit 6B according to the present embodiment, circuit elements such as filters may be disposed on signal paths that connect multiplexer 1B and low noise amplifiers 71 and 72 and on signal paths that connect multiplexer 1B and power amplifiers 81, 82A, and 82B, according to a requirement specification regarding transmission characteristics and reception characteristics that communication device 7B needs to satisfy.

As described above, multiplexers 1 according to Embodiments 1 and 2 each include: common terminal 100; acoustic wave filter 30 connected to common terminal 100, acoustic wave filter 30 including an acoustic wave resonator; acoustic wave filter 20 connected to common terminal 100, acoustic wave filter 20 including an acoustic wave resonator; and inductor-capacitor (LC) filter 10 connected to common terminal 100, LC filter 10 including one or more inductors and one or more capacitors. A passband of acoustic wave filter 20 is between a passband of acoustic wave filter 30 and a passband of LC filter 10, a frequency gap between the passband of acoustic wave filter 20 and the passband of LC filter 10 is greater than a frequency gap between the passband of acoustic wave filter 30 and the passband of acoustic wave filter 20, the passband of acoustic wave filter 30 includes one of a transmission band or a reception band of a first communication band, the passband of LC filter 10 includes a remaining one of the transmission band or the reception band of the first communication band, and the passband of acoustic wave filter 20 includes one of a transmission band and a reception band of a second communication band different from the first communication band.

According to the above configuration, in a frequency relation in which one of the transmission band and the reception band of the second communication band is between the transmission band and the reception band of the first communication band, when the first communication band and the second communication band are simultaneously used, acoustic wave filters 20 and 30 each having steep attenuation slopes at the two edges of the passband are used as filters having passbands that are two frequency bands adjacent to each other with the narrow frequency gap GAP1 therebetween. On the other hand, LC filter 10 having a low-loss wide passband is used as a filter having a passband that is another frequency band with the wide frequency gap GAP2.

Accordingly, acoustic wave filters 20 and 30 can be given high-level isolation characteristics achieved by steep attenuation slopes, and LC filter 10 can be given a wide and low-loss passband. Thus, low-loss multiplexer 1 can be provided which increases the isolation level by handling frequency gaps between communication bands and the bandwidths of the communication bands.

The first communication band may be a communication band used in 5th Generation New Radio (5G NR). Accordingly, a signal in 5G NR can be transferred while loss is kept low.

The passband of LC filter 10 may be wider than the passband of acoustic wave filter 30, and may be wider than the passband of acoustic wave filter 20.

Accordingly, a wide band with the relatively wide frequency gap GAP2 that is one of the transmission band and the reception band of the first communication band can be used as the passband of LC filter 10, and a narrow band with the relatively narrow frequency gap GAP1 that is the other of the transmission band and the reception band of the first communication band can be used as the passband of acoustic wave filter 30. Thus, a signal in the first communication band can be transferred while loss is kept low and the isolation level is kept high.

The passband of LC filter 10 may be higher than a frequency at which a higher-order mode spurious emission is caused by acoustic wave filter 30.

When acoustic wave filter 30 has a configuration in which leaky waves that propagate along the surface of a piezoelectric substrate made of $LiTaO_3$ are used or a configuration in which Rayleigh waves that propagate along the surface of a piezoelectric substrate made of $LiNbO_3$ are used, so-called higher-order mode spurious emissions are generated in a frequency domain defined by 1.2 to 1.4 times the fundamental wave frequency. In contrast, the passband of LC filter 10 is higher than a frequency at which a higher-order mode spurious emission is caused by acoustic wave filter 30, and thus deterioration of characteristics of LC filter 10 due to the spurious emission can be lowered.

The passband of LC filter 10 may be higher than the passband of acoustic wave filter 30.

The passband of LC filter 10 may be lower than the passband of acoustic wave filter 30.

The first communication band may be at least one of n91, n92, n93, or n94 of 5th Generation New Radio (5G NR).

The second communication band may be Band 8 of 4th Generation Long Term Evolution (4G LTE), and the passband of acoustic wave filter 30 may include a remaining one of the transmission band and the reception band of the second communication band.

The passband of acoustic wave filter 30 may include one of a transmission band and a reception band of a third communication band different from the first communication band and the second communication band, and the third communication band may be Band 20 of 4th Generation Long Term Evolution (4G LTE).

The passband of LC filter 10 may include a fourth communication band different from the first communication band and the second communication band, and the fourth communication band may be at least one of n50 or n51 of 5th Generation New Radio (5G NR).

LC filter 10 may include: one or more series-arm circuits disposed on a signal path that connects common terminal 100 and input/output terminal 120; and one or more parallel-arm circuits disposed between the signal path and a ground, a first series-arm circuit disposed closest to common terminal 100, out of the one or more series-arm circuits, may be one of an inductor and a capacitor, and a first parallel-arm circuit disposed closest to common terminal 100, out of the one or more parallel-arm circuits, may be a remaining one of the inductor and the capacitor.

Accordingly, attenuation poles of an LC resonance circuit constituted by the capacitor and the inductor of LC filter 10 can be formed in passing characteristics of acoustic wave filters 30 and 20. Accordingly, attenuation characteristics of acoustic wave filters 30 and 20 can be improved, and the size of multiplexer 1 can be reduced owing to the reduction in the number of circuit elements since the circuit elements of LC filter 10 are used.

A multiplexer includes: common terminal 100; acoustic wave filter 30 connected to common terminal 100, acoustic wave filter 30 including an acoustic wave resonator; acoustic wave filter 20 connected to common terminal 100, acoustic wave filter 20 including an acoustic wave resonator; and inductor-capacitor (LC) filter 10 connected to common terminal 100, LC filter 10 including one or more inductors and one or more capacitors. A passband of acoustic wave filter 20 is between a passband of acoustic wave filter 30 and a passband of LC filter 10, a frequency gap between the passband of acoustic wave filter 20 and the passband of LC filter 10 is greater than a frequency gap between the passband of acoustic wave filter 30 and the passband of acoustic wave filter 20, the passband of acoustic wave filter 30 includes one of a transmission band and a reception band of a first communication band, the passband of LC filter 10 includes a transmission band of an unlicensed band when the passband of acoustic wave filter 30 includes the reception band of the first communication band, and includes a reception band of the unlicensed band when the passband of acoustic wave filter 30 includes the transmission band of the first communication band, the unlicensed band being a band for assisting transfer of a signal in the first communication band, and the passband of acoustic wave filter 20 includes one of a transmission band and a reception band of a second communication band different from the first communication band.

According to the above configuration, in a frequency relation in which the second communication band is between the first communication band and the unlicensed band for assisting transfer of a signal in the first communication band, acoustic wave filters 20 and 30 each having steep attenuation slopes at the two edges of the passband are used as filters having passbands that are two frequency bands adjacent to each other with narrow frequency gap GAP1 therebetween, taking into consideration the simultaneous use of the first communication band and the second communication band. On the other hand, LC filter 10 having a low-loss wide passband is used as a filter having a passband that is another frequency band with wide frequency gap GAP2. Accordingly, acoustic wave filters 20 and 30 can be given high-level isolation characteristics achieved by steep attenuation slopes, and LC filter 10 can be given a wide and low-loss passband. Thus, a low-loss multiplexer can be provided which increases the isolation level by handling frequency gaps between communication bands and the bandwidths of the communication bands.

Front end circuit 6 includes: multiplexer 1; low noise amplifier 71 configured to amplify a reception signal in the fourth communication band, and a reception signal in the reception band of the first communication band; power amplifier 81 configured to amplify a transmission signal in the fourth communication band; and switches 61 and 62 configured to switch a connection of LC filter 10 between low noise amplifier 71 and power amplifier 81.

According to this, LC filter 10 and acoustic wave filter 30 can transfer reception and transmission signals in the first communication band by FDD, and LC filter 10 can transfer reception and transmission signals in the fourth communication band by TDD.

Communication device 4 includes: antenna 2; RFIC 3 configured to process radio frequency signals transmitted and received by antenna 2; and multiplexer 1 or front-end circuit 6 configured to transfer the radio frequency signals between antenna 2 and RFIC 3.

Communication device 4 can be provided which increases the isolation level by handling frequency gaps between communication bands and the bandwidths of the communication bands.

Other Embodiments

The above has described the multiplexer, the front-end circuit, and the communication device according to the present disclosure, based on the embodiments, the examples, and the variations, yet the present disclosure is not limited to the above embodiments, the examples, and the variations. The present disclosure also encompasses another embodiment achieved by combining arbitrary elements in the above embodiments, the above examples, and the above variations, variations as a result of applying, to the embodiments, various modifications that may be conceived by those skilled in the art without departing from the scope of the present disclosure, and various devices that include the multiplexer, the front-end circuit, and the communication device according to the present disclosure.

For example, one or more matching elements such as an inductor and a capacitor, and one or more switch circuits may be connected between circuit elements in each of the multiplexers, the front-end circuits, and the communication devices according to the above embodiments, the above examples, and the above variations. Note that the inductor may include a line inductor achieved by a line that connects circuit elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The present disclosure can be widely used in a communication apparatus such as a mobile phone, as a multiplexer, a front-end circuit, and a communication device that are applicable to a multi-band system that supports 5G-NR n91 to n94.

The invention claimed is:

1. A multiplexer, comprising:
a first acoustic wave filter connected to a common terminal, the first acoustic wave filter including an acoustic wave resonator;
a second acoustic wave filter connected to the common terminal, the second acoustic wave filter including an acoustic wave resonator; and
an inductor-capacitor (LC) filter connected to the common terminal, the LC filter including one or more inductors and one or more capacitors,
wherein a passband of the second acoustic wave filter is between a passband of the first acoustic wave filter and a passband of the LC filter,
a frequency gap between the passband of the second acoustic wave filter and the passband of the LC filter is greater than a frequency gap between the passband of the first acoustic wave filter and the passband of the second acoustic wave filter, the passband of the first acoustic wave filter includes one of a transmission band or a reception band of a first communication band, the passband of the LC filter includes a remaining one of the transmission band or the reception band of the first communication band, and the passband of the second acoustic wave filter includes one of a transmission band or a reception band of a second communication band different from the first communication band.

2. The multiplexer according to claim 1,
wherein the first communication band is a communication band used in 5th Generation New Radio (5G NR).

3. The multiplexer according to claim 1,
wherein the passband of the LC filter is wider than the passband of the first acoustic wave filter, and is wider than the passband of the second acoustic wave filter.

4. The multiplexer according to claim 1,
wherein the passband of the LC filter is higher than a frequency at which a higher-order mode spurious emission is caused by the first acoustic wave filter.

5. The multiplexer according to claim 1,
wherein the passband of the LC filter is higher than the passband of the first acoustic wave filter.

6. The multiplexer according to claim 1,
wherein the passband of the LC filter is lower than the passband of the first acoustic wave filter.

7. The multiplexer according to claim 1,
wherein the first communication band is at least one of n91, n92, n93, or n94 of 5th Generation New Radio (5G NR).

8. The multiplexer according to claim 1,
wherein the second communication band is Band 8 of 4th Generation Long Term Evolution (4G LTE), and
the passband of the first acoustic wave filter includes a remaining one of the transmission band or the reception band of the second communication band.

9. The multiplexer according to claim 1,
wherein the passband of the first acoustic wave filter includes one of a transmission band or a reception band of a third communication band different from the first communication band and the second communication band, and
the third communication band is Band 20 of 4th Generation Long Term Evolution (4G LTE).

10. The multiplexer according to claim 1,
wherein the passband of the LC filter includes a fourth communication band different from the first communication band and the second communication band, and
the fourth communication band is at least one of n50 or n51 of 5th Generation New Radio (5G NR).

11. A front end circuit, comprising:
the multiplexer according to claim 10;
a low noise amplifier configured to amplify a reception signal in the fourth communication band, and a reception signal in the remaining one of the transmission band or the reception band of the first communication band;

a power amplifier configured to amplify a transmission signal in the fourth communication band; and
a first switch configured to switch a connection of the LC filter between the low noise amplifier and the power amplifier.

12. The multiplexer according to claim 1,
wherein the LC filter includes:
one or more series-arm circuits disposed on a signal path that connects the common terminal and a first input/output terminal; and
one or more parallel-arm circuits disposed between the signal path and a ground,
a first series-arm circuit disposed closest to the common terminal, out of the one or more series-arm circuits, is one of an inductor or a capacitor, and
a first parallel-arm circuit disposed closest to the common terminal, out of the one or more parallel-arm circuits, is a remaining one of the inductor or the capacitor.

13. A communication device, comprising:
an antenna;
a radio frequency (RF) signal processing circuit configured to process radio frequency signals transmitted and received by the antenna; and
the multiplexer according to claim 1 configured to transfer the radio frequency signals between the antenna and the RF signal processing circuit.

14. A multiplexer, comprising:
a first acoustic wave filter connected to a common terminal, the first acoustic wave filter including an acoustic wave resonator;
a second acoustic wave filter connected to the common terminal, the second acoustic wave filter including an acoustic wave resonator; and
an inductor-capacitor (LC) filter connected to the common terminal, the LC filter including one or more inductors and one or more capacitors,
wherein a passband of the second acoustic wave filter is between a passband of the first acoustic wave filter and a passband of the LC filter,
a frequency gap between the passband of the second acoustic wave filter and the passband of the LC filter is greater than a frequency gap between the passband of the first acoustic wave filter and the passband of the second acoustic wave filter,
the passband of the first acoustic wave filter includes one of a transmission band and a reception band of a first communication band,
the passband of the LC filter includes a transmission band of an unlicensed band when the passband of the first acoustic wave filter includes the reception band of the first communication band, and includes a reception band of the unlicensed band when the passband of the first acoustic wave filter includes the transmission band of the first communication band, the unlicensed band being a band for assisting transfer of a signal in the first communication band, and
the passband of the second acoustic wave filter includes one of a transmission band or a reception band of a second communication band different from the first communication band.

* * * * *

UNITED STATES PATENT AND TRADEMARK OFFICE
CERTIFICATE OF CORRECTION

PATENT NO. : 11,362,636 B2
APPLICATION NO. : 17/163781
DATED : June 14, 2022
INVENTOR(S) : Hirotsugu Mori It is certified that error appears in the above-identified patent and that said Letters Patent is hereby corrected as shown below:

In the Specification

Column 12, Line 29, "switches" should be -- switches 61 --.

Signed and Sealed this
Seventh Day of March, 2023

Katherine Kelly Vidal
*Director of the United States Patent and Trademark Office*